United States Patent
Aflatouni

[11] Patent Number: 6,087,863
[45] Date of Patent: Jul. 11, 2000

[54] METHOD FOR IMPROVING THE EFFICIENCY OF DISCHARGING CAPACITIVE LOADS IN H-BRIDGE SWITCHING NETWORKS

[75] Inventor: Roshanak Aflatouni, Cupertino, Calif.

[73] Assignee: Supertex, Inc., Sunnyvale, Calif.

[21] Appl. No.: 09/039,429

[22] Filed: Mar. 16, 1998

[51] Int. Cl.[7] .............................. H03K 3/00; H03B 1/00
[52] U.S. Cl. .......................................... 327/111; 327/423
[58] Field of Search ................................ 327/111, 369, 327/374–377, 383, 389, 391, 423, 424, 427, 434, 437, 478, 494, 581, 587

[56] References Cited

U.S. PATENT DOCUMENTS

| | | | |
|---|---|---|---|
| 4,926,354 | 5/1990 | Pattantyus | 363/98 |
| 5,270,633 | 12/1993 | Dijkmans | 318/810 |
| 5,428,522 | 6/1995 | Millner et al. | 363/63 |
| 5,741,303 | 4/1998 | Kroll et al. | 607/5 |
| 5,784,270 | 7/1998 | Permuy | 363/132 |
| 5,808,884 | 9/1998 | Teggatz et al. | 363/98 |
| 5,821,701 | 10/1998 | Teggatz et al. | 315/307 |

*Primary Examiner*—My-Trang Nu Ton
*Attorney, Agent, or Firm*—Harry M. Weiss; Jeffrey Weiss; Paul W. Davis

[57] ABSTRACT

A method for improving the efficiency of H-bridge electrical switching devices that drive a capacitive load such as electroluminescent lamps, liquid crystal devices and piezo-electric transducers. The method provides for discharge steps that first discharge the capacitive load to a difference in voltage potential of zero (0) volts before re-charging from the opposite side. By implementing the method, the DC power supply will only be required to charge the capacitive load from zero (0) volts to +Vcs volts, rather than +Vcs volts to –Vcs volts as in prior art. With less energy required from the DC power supply to accomplish the same result, a more efficient switching network is achieved.

17 Claims, 2 Drawing Sheets

METHOD FOR IMPROVING THE EFFICIENCY OF DISCHARGING CAPACITIVE LOADS IN H-BRIDGE SWITCHING NETWORKS

BACKGROUND OF THE INVENTION

1. Field of the Invention

This invention relates generally to electrical devices which are capable of driving a capacitive load. Specifically, this invention provides a method for improving the efficiency of H-bridge electrical switching devices that drive a capacitive load.

2. Description of the Prior Art

The current state of the art describes an H-bridge configuration which consists of four switches as shown in FIG. 1A. The switches are typically bipolar transistors, MOSFET transistors or other electronic devices known to those skilled in the art. A capacitive load 6 is coupled to the H-bridge. Examples of capacitive loads include, but are not limited to, electroluminescent (EL) lamps, liquid crystal elements and piezoelectric transducers.

The H-bridge functions to convert a DC voltage to an AC voltage for driving the capacitive load by manipulating the switches. Referring to FIG. 1A, the method described by the current state of the art for H-bridges is to close SW1 1 and SW2 2 which charges the capacitive load 6 with a potential equal to Vcs 7. Switches SW1 1 and SW2 2 are then switched open and SW3 3 and SW4 4 are switched closed as shown in FIG. 1B. This has the effect of discharging the capacitive load 6 in one direction and then charging the capacitive load 6 with a potential also equal to Vcs 7, but in the opposite direction. Thus, the capacitive load effectively sees a peak-to-peak AC voltage that is two times that of the DC voltage, Vcs 7. In other words, the capacitive load 6 sees a voltage swing of +Vcs to −Vcs. This method of switching the DC power to the capacitive load on the order of 50 Hz to 5000 Hz leads to inefficient operation because of the peak to peak voltage swing is double that of Vcs.

Therefore, a need existed to provide a method for improving the efficiency of H-bridge electrical switching devices which drive a capacitive load that reduces the peak to peak voltage swing across the capacitive load.

SUMMARY OF THE INVENTION

In accordance with one embodiment of the present invention, it is an objective to provide a method for improving the efficiency of H-bridge electrical switching devices that drive a capacitive load.

It is another object of the present invention to provide a method for improving the efficiency of H-bridge electrical switching devices that drive EL lamps, liquid crystal devices and piezoelectric transducers.

In one embodiment of the present invention a method for improving the efficiency of H-bridge switching networks for driving a capacitive load comprising the steps of providing a first charging path, providing a discharging path subsequent to providing the charging path and providing a second charging path subsequent to providing the discharging path.

In another embodiment of the present invention a method for improving the efficiency of H-bridge switching networks for driving a capacitive load further comprising the step of providing a second discharging path subsequent to providing the second charging path.

The foregoing and other objects, features, and advantages of the invention will be apparent from the following, more particular, description of the preferred embodiments of the invention, as illustrated in the accompanying drawings.

DETAILED DESCRIPTION OF THE PREFERRED EMBODIMENT

Referring to FIGS. 2A–2D, where like numerals and symbols represent like elements, a method for improving the efficiency of H-bridge switching networks 5 for driving a capacitive load 6 comprising the steps of providing a first charging path, providing a discharging path subsequent to providing the charging path, providing a second charging path subsequent to providing the discharging path, and providing a second discharging path subsequent to providing the second charging path is disclosed.

Figure 1A:
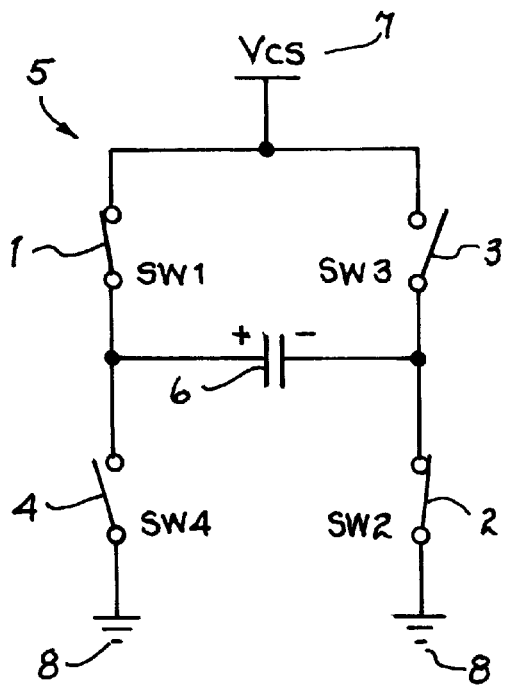
FIG. 1A illustrates a first charging and discharging path in H-bridge switching networks for driving a capacitive load in the prior art.
Figure 1B:
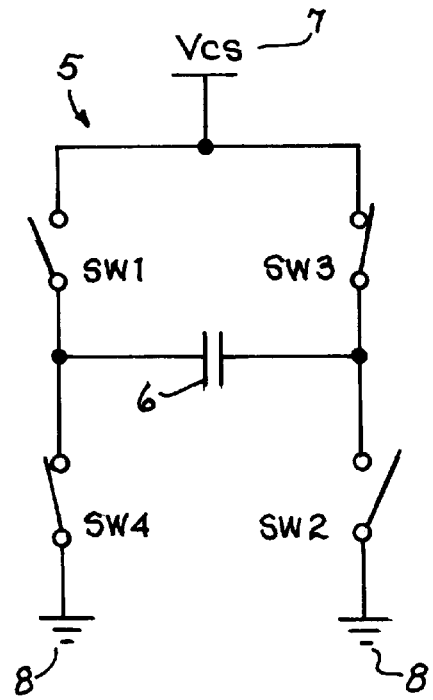
FIG. 1B illustrates a second charging and discharging path.
Figure 2A:
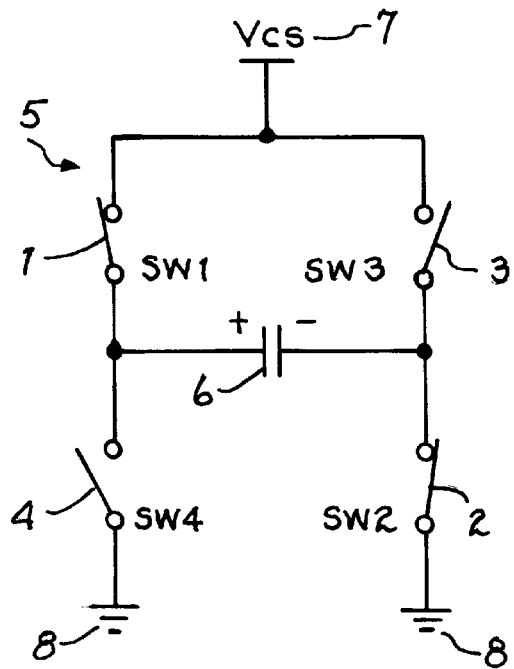
FIG. 2A illustrates a first charging path in the present invention.

Referring specifically to FIG. 2A, the first charging path comprises the steps of providing two switches 1 & 2 which close to complete an electrical circuit between a DC voltage source (Vcs) 7 and a ground reference 8 across the capacitive load 6. In the completed circuit, Vcs 7 is coupled to a first side of the capacitive load 6 and the ground reference 8 is coupled to a second side of the capacitive load 6. Also shown in FIG. 2A are two switches 3 & 4 which open to break a second electrical circuit between Vcs 7 and the ground reference 8 across the capacitive load 6.

Figure 2B:
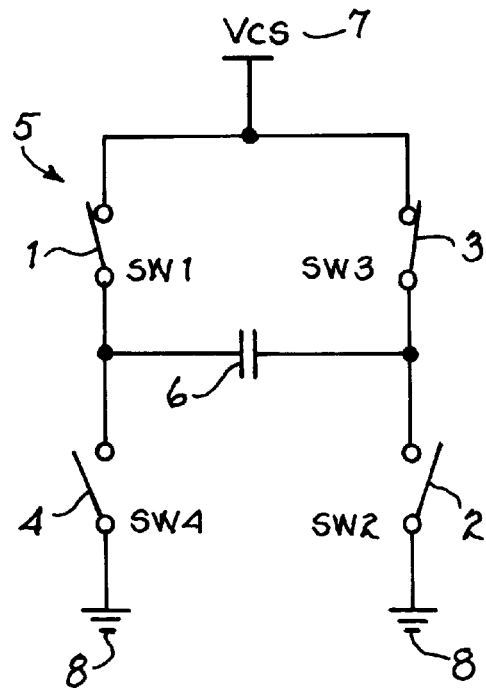
FIG. 2B illustrates a first discharging path by coupling each side of the capacitive load to the DC power source (Vcs).

Referring to FIG. 2B, the discharging path comprises the steps of providing two switches 1 & 3 which close to complete an electrical circuit between the two terminals of Vcs 7 across the capacitive load 6. In the completed circuit, Vcs 7 is coupled to a first and second sides of the capacitive load 6. Also in FIG. 2B, the two switches 2 & 4 open to break a second electrical circuit between the ground reference 8 across the capacitive load 6.

Figure 2C:
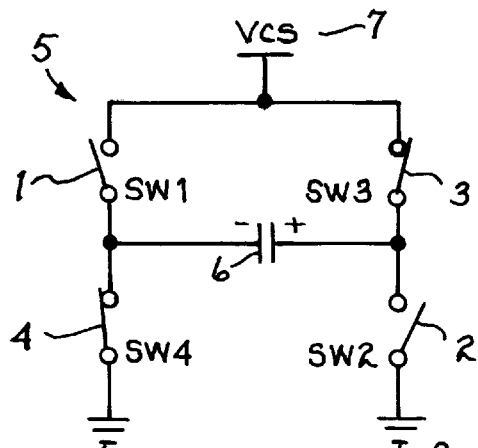
FIG. 2C illustrates a second charging path.

Referring to FIG. 2C, the second charging path comprises the steps of providing two switches 3 & 4 which close to complete the electrical circuit between Vcs 7 and the ground reference 8 across the capacitive load 6. In this completed circuit, Vcs 7 is coupled to the second side of the capacitive load 6 and the ground reference 8 is coupled to the first side of the capacitive load 6. Also in FIG. 2C, the two switches 1 & 2 open to break the electrical circuit between Vcs 7 and the ground reference 8 across the capacitive load 6.

Figure 2D:
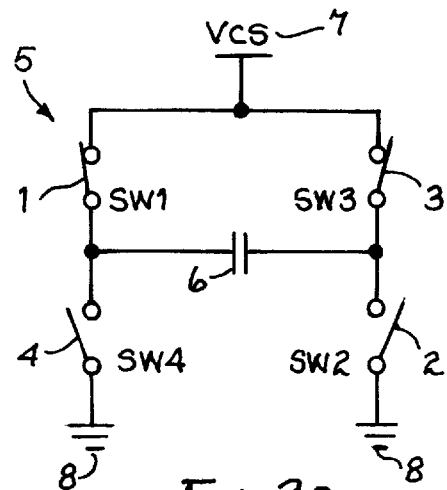
FIG. 2D illustrates a second discharging path, again by coupling each side of the capacitive load to Vcs.

Referring to FIG. 2D, the second discharging path comprises the steps of providing two switches 1 & 3 which close to complete an electrical circuit between the two terminals of Vcs 7 across the capacitive load 6. In this completed circuit, Vcs 7 is coupled to a first and second sides of the capacitive load 6. Also shown in FIG. 2D are two switches 2 & 4 which open to break a second electrical circuit between the ground reference 8 across the capacitive load 6.

Referring to FIG. 3, where like numerals and symbols represent like elements, a second method for improving the efficiency of H-bridge switching networks 5 for driving a capacitive load 6 comprising the steps of providing a first charging path, providing a discharging path subsequent to providing the charging path, providing a second charging path subsequent to providing the discharging path, and providing a second discharging path subsequent to providing the second charging path is disclosed.

Figure 3A:
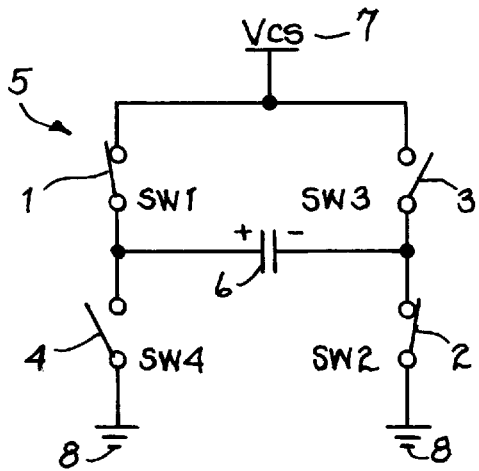
FIG. 3A illustrates a first charging path in the present invention.

Referring specifically to FIG. 3A, the first charging path comprises the equivalent steps as described above in FIG. 2A.

Figure 3B:
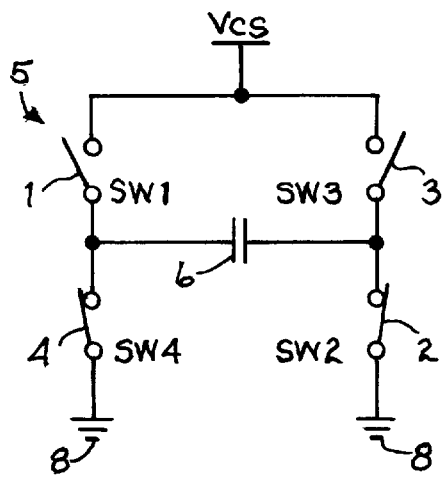
FIG. 3B illustrates a first discharging path by coupling each side of the capacitive load to ground reference.

Referring to FIG. 3B, the discharging path comprises the steps of providing two switches 2 & 4 which close to complete a second electrical circuit between the ground reference 8 across the capacitive load 8. In this completed circuit, the ground reference 8 is coupled to the first and second sides of the capacitive load 6. Also shown in FIG. 3B are two switches 1 & 3 which open to break an electrical circuit between the two terminals of Vcs 7 across the capacitive load 6.

Figure 3C:
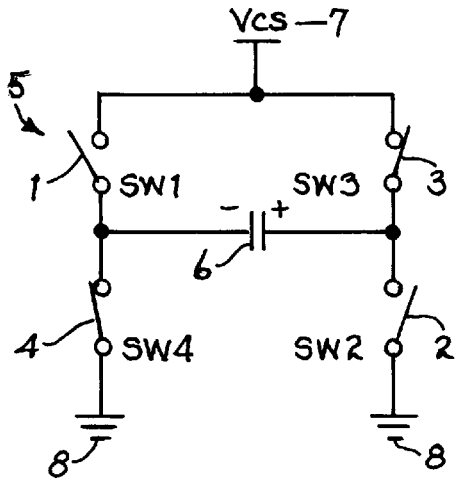
FIG. 3C illustrates a second charging path.

Referring to FIG. 3C, the second charging path comprises the equivalent steps as described above in FIG. 2C.

Figure 3D:
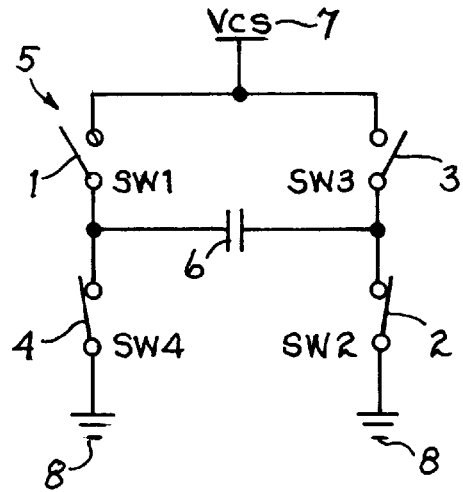
FIG. 3D illustrates a second discharging path, again by coupling each side of the capacitive load to ground reference.

Referring to FIG. 3D, the second discharging path comprises the steps of providing two switches 2 & 4 which close to complete a second electrical circuit between the ground reference 8 across the capacitive load 8. In this completed circuit, the ground reference 8 is coupled to the first and second side of the capacitive load 6. Also shown in FIG. 3B are two switches 1 & 3 which open to break an electrical circuit between the two terminals of Vcs 7 across the capacitive load 6.

The first and second discharge steps, as described in the embodiments above and illustrated in FIGS. 2A–2D and 3A–3D, discharge the capacitive load 6 to a difference in voltage potential of zero (0) volts. By implementing the discharge steps, the Vcs power supply will only be required to charge the capacitive load from zero (0) volts to +Vcs volts, rather than +Vcs volts to −Vcs volts as in prior art. With less energy required from the Vcs power supply to accomplish the same result, a more efficient switching network is achieved.

Each of the two embodiments described above in FIGS. 2A–2D and 3A–3D uses the identical discharge method for both the first and second discharge steps, i.e. discharge is either through Vcs as in the first embodiment or through ground reference as in the second embodiment. However, the present invention is not limited to this process. In using the term "path" to further define the step, the discharge path is independently selectable regardless of the previous charging path or the previous discharge path. In other words the second discharge step or path may be through either Vcs or ground reference regardless of which method was used for the first discharge step or path.

For each of the charging and discharging paths, as illustrated in FIGS. 2A–2D and 3A–3D, the first and second plurality of switches are each comprised of two switches. Furthermore, as described above, the first and second plurality of switches perform both charging and discharging functions. However, the invention is not limited to the number or the dedicated functionality of the switches described above. Other combinations of more or less switches in a variety of configurations which perform substantially the same methods described above may be anticipated by those skilled in the art. For example, one set of switches could be dedicated to the charging paths and a completely independent set could be dedicated to the discharging paths.

Furthermore, the first and second plurality of switches as illustrated in FIGS. 2 and 3 are typically implemented by either MOSFET or bipolar transistors. However, neither the invention nor the switches are limited to these technologies.

The capacitive load 6 illustrated in FIGS. 2 and 3 is defined as a load with an electrical behavior similar to that of a capacitor. In the preferred embodiment, the capacitive load 6 may be comprised of at least one electroluminescent lamp, at least one liquid crystal device, or at least one piezoelectric transducer. However, neither the invention nor the capacitive loads are limited to these devices.

Although the invention has been particularly shown and described with reference to a preferred embodiment thereof, it will be understood by those skilled in the art that changes in form and detail may be made therein without departing from the spirit and scope of the invention.

What is claimed is:

1. A method for improving the efficiency of H-bridge switching networks for driving a capacitive load comprising the steps of:

providing a first charging path;

providing a discharging path subsequent to providing the first charging path wherein the discharging path is distinct from the first charging path; and providing a second charging path subsequent to providing the discharging path wherein the second charging path is distinct from the first charging path and from the discharging path.

2. The method in accordance with claim 1 wherein the first charging path comprises the steps of:

providing a first plurality of switches which close to complete a first electrical circuit between a DC voltage source (Vcs) and a ground reference across the capacitive load where the Vcs is coupled to a first side of the capacitive load and the ground reference is coupled to a second side of the capacitive load; and providing a second plurality of switches which open to break a second electrical circuit between the Vcs and a ground reference across the capacitive load.

3. The method in accordance with claim 2 wherein the first and second plurality of switches are transistors.

4. The method in accordance with claim 1 wherein the discharging path comprises the steps of:

providing a first plurality of switches which close to complete a first electrical circuit between a DC voltage source (Vcs) across the capacitive load where the Vcs is coupled to a first and second side of the capacitive load; and providing a second plurality of switches which open to break a second electrical circuit between a ground reference across the capacitive load.

5. The method in accordance with claim 4 wherein the first and second plurality of switches are transistors.

6. The method in accordance with claim 1 wherein the discharging path comprises the steps of:

providing a first plurality of switches which close to complete a first electrical circuit between a ground reference across the capacitive load where the ground reference is coupled to a first and second side of the capacitive load; and providing a second plurality of switches which open to break a second electrical circuit between a DC voltage source (Vcs) across the capacitive load.

7. The method in accordance with claim 6 wherein the first and second plurality of switches are transistors.

8. The method in accordance with claim 1 wherein the second charging path comprises the steps of:

providing a first plurality of switches which close to complete a first electrical circuit between a DC voltage source (Vcs) and a ground reference across the capacitive load where the Vcs is coupled to a first side of the capacitive load and the ground reference is coupled to the second side of the capacitive load; and providing a second plurality of switches which open to break a second electrical circuit between the Vcs and the ground reference across the capacitive load.

9. The method in accordance with claim 8 wherein the first and second plurality of switches are transistors.

10. The method in accordance with claim 1 further comprising the step of providing a second discharging path subsequent to providing the second charging path wherein the second discharging path is distinct from the first charging path and from the second charging path.

11. The method in accordance with claim 10 wherein the second discharging path comprises the steps of:

providing a first plurality of switches which close to complete a first electrical circuit between a DC voltage source (Vcs) across the capacitive load where the Vcs is coupled to first and second sides of the capacitive load; and providing a second plurality of switches which open to break a second electrical circuit between the ground reference across the capacitive load.

12. The method in accordance with claim 11 wherein the first and second plurality of switches are transistors.

13. The method in accordance with claim 10 wherein the second discharging path comprises the steps of:

providing a first plurality of switches which close to complete a first electrical circuit between the ground reference across the capacitive load where the ground reference is coupled to first and second sides of the capacitive load; and providing a second plurality of switches which open to break a second electrical circuit between a DC voltage source (Vcs) across the capacitive load.

14. The method in accordance with claim 13 wherein the first and second plurality of switches are transistors.

15. The method in accordance with claim 1 wherein the capacitive load comprises at least one electroluminescent lamp.

16. The method in accordance with claim 1 wherein the capacitive load comprises at least one liquid crystal device.

17. The method in accordance with claim 1 wherein the capacitive load comprises at least one piezoelectric transducer.

* * * * *